(12) United States Patent
Peterson et al.

(10) Patent No.: US 10,597,486 B2
(45) Date of Patent: Mar. 24, 2020

(54) ENCAPSULANT COMPOSITION FOR USE WITH ELECTRICAL COMPONENTS IN HARD DISK DRIVES, AND RELATED ELECTRICAL COMPONENTS AND HARD DISK DRIVES

(71) Applicant: Seagate Technology LLC, Cupertino, CA (US)

(72) Inventors: Michael John Peterson, Prior Lake, MN (US); Michael R. Fabry, Apple Valley, MN (US)

(73) Assignee: Seagate Technology LLC, Cupertino, CA (US)

( * ) Notice: Subject to any disclaimer, the term of this patent is extended or adjusted under 35 U.S.C. 154(b) by 254 days.

(21) Appl. No.: 15/799,790

(22) Filed: Oct. 31, 2017

(65) Prior Publication Data

US 2018/0118876 A1 May 3, 2018

Related U.S. Application Data

(60) Provisional application No. 62/416,546, filed on Nov. 2, 2016.

(51) Int. Cl.
| | |
|---|---|
| *C08G 59/32* | (2006.01) |
| *G11B 33/02* | (2006.01) |
| *G11B 25/04* | (2006.01) |
| *C08L 63/10* | (2006.01) |
| *C09J 163/10* | (2006.01) |
| *G11B 5/48* | (2006.01) |
| *G11B 33/14* | (2006.01) |
| *C08G 59/18* | (2006.01) |
| *H01L 23/29* | (2006.01) |

(Continued)

(52) U.S. Cl.
CPC ....... *C08G 59/3209* (2013.01); *C08G 59/184* (2013.01); *C08L 63/10* (2013.01); *C09D 163/00* (2013.01); *C09J 163/10* (2013.01); *G11B 5/4826* (2013.01); *G11B 25/043* (2013.01); *G11B 33/02* (2013.01); *G11B 33/1446* (2013.01); *H01L 21/56* (2013.01); *H01L 23/295* (2013.01); *B32B 2037/1253* (2013.01); *C08G 59/50* (2013.01); *H01L 21/563* (2013.01); *H05K 3/285* (2013.01); *H05K 2203/013* (2013.01)

(58) Field of Classification Search
CPC ..... H01L 23/295; H01L 23/28; H01L 21/563; H01L 21/56; C09J 163/10; C09J 163/00; C08G 59/3209; C08L 63/10; G11B 33/1446; G11B 33/14; G11B 33/126; G11B 5/4826
See application file for complete search history.

(56) References Cited

U.S. PATENT DOCUMENTS

| | | |
|---|---|---|
| 6,376,100 B1 | 4/2002 | Shiobara et al. |
| 6,680,436 B2 | 1/2004 | Xu et al. |

(Continued)

OTHER PUBLICATIONS

Technical Data Sheet, Formulation LX5-155-16 XNS05 40%, One Step Chip Attach for Conventional Reflow Processing, OSCA-R, Kester Inc., Jan. 28, 2016 (3 pages).

(Continued)

*Primary Examiner* — Daniel McNally
(74) *Attorney, Agent, or Firm* — Kagan Binder, PLLC

(57) ABSTRACT

The present disclosure relates to encapsulant compositions for use with hard disk drive devices.

16 Claims, 1 Drawing Sheet

(51) Int. Cl.
*H01L 21/56* (2006.01)
*C09D 163/00* (2006.01)
*B32B 37/12* (2006.01)
*C08G 59/50* (2006.01)
*H05K 3/28* (2006.01)

(56) References Cited

U.S. PATENT DOCUMENTS

| | | |
|---|---|---|
| 6,946,744 B2 | 9/2005 | Maxwell et al. |
| 6,977,338 B1 | 12/2005 | Muro et al. |
| 7,323,360 B2 | 1/2008 | Gonzalez et al. |
| 7,332,821 B2 | 2/2008 | Bernier et al. |
| 8,421,201 B2 | 4/2013 | Lee et al. |
| 8,492,199 B2 | 7/2013 | Coffin et al. |
| 2002/0046860 A1* | 4/2002 | Xu ........................ H01L 21/563 174/521 |
| 2014/0177149 A1 | 6/2014 | Ramalingam et al. |

OTHER PUBLICATIONS

Materials for printed boards and other interconnecting structures, International Standard, CEI/IEC 61249-2-21 (2003) (56 pages).
Duffy et al., "One Step Chip Attach Materials (OSCA) for Conventional Mass Reflow Processing", Oct. 14, 2014, iMaps, San Diego, CA (27 pages).

\* cited by examiner

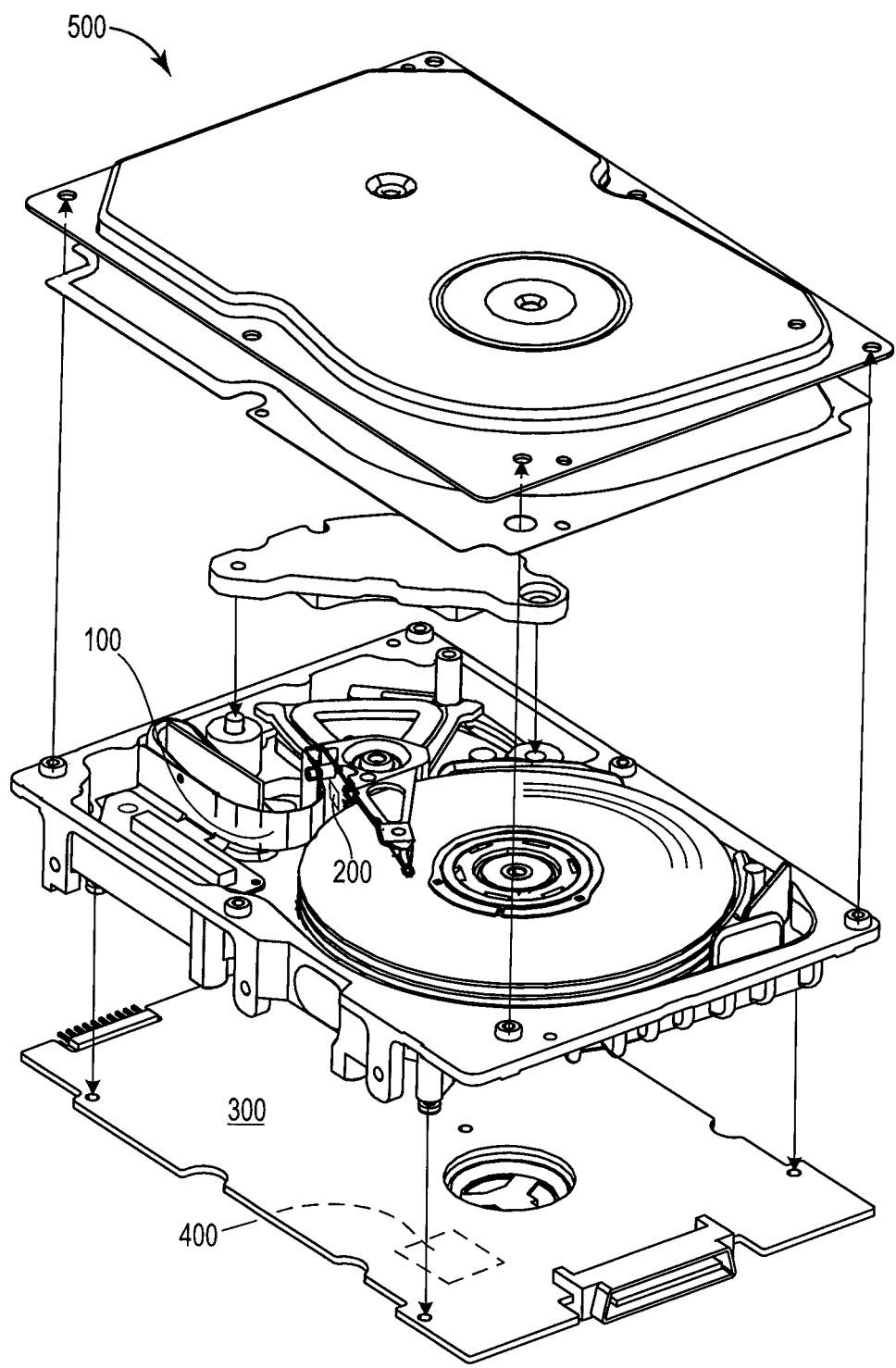

US 10,597,486 B2

ENCAPSULANT COMPOSITION FOR USE WITH ELECTRICAL COMPONENTS IN HARD DISK DRIVES, AND RELATED ELECTRICAL COMPONENTS AND HARD DISK DRIVES

RELATED APPLICATION

The present Application claims priority to U.S. provisional patent application having application No. 62/416,546, filed on Nov. 2, 2016, which provisional application is incorporated herein by reference in its entirety.

FIELD

The present disclosure relates to computer hard disk drive components, and related methods of making. In particular, the present invention relates to including encapsulant compositions on or in hard disk drive components.

BACKGROUND

Computer hard disk drives can store information on magnetic disks. The information can be stored on each disk in concentric tracks, divided into sectors. The information can be written to and read from a disk by a transducer head, mounted on an actuator arm capable of moving the transducer head radially over the disk. Accordingly, the movement of the actuator arm allows the transducer head to access different tracks. The disk can be rotated by a spindle motor at a high speed, allowing the transducer head to access different sectors on the disk.

SUMMARY

The present disclosure includes embodiments of a method of coating one or more surfaces of at least a portion of an electrical structure for use in a hard disk drive, wherein the method comprises:
  a) applying an uncured encapsulant composition on at least a portion of a surface of the electrical structure, wherein the uncured encapsulant composition comprises:
    i) uncured epoxy resin component; and
    ii) an inorganic filler particle component, wherein the inorganic filler particle component is present in an amount of at least 0.05% by weight of the uncured encapsulant composition; and
  b) curing the encapsulant composition, wherein the cured encapsulant composition has a Total Outgassing value of 1000 nanograms per gram or less of outgassed compounds of cured encapsulant composition according to Outgassing Test Procedure.

The present disclosure also includes embodiments of an electrical structure for use in a hard disk drive, wherein the electrical structure has a coating on at least a portion of a surface of the electrical structure, wherein the coating comprises a cured encapsulant composition, wherein the cured encapsulant composition comprises:
  a) cured epoxy resin component; and
  b) an inorganic filler particle component, wherein the inorganic filler particle component is present in an amount of at least 0.05% by weight of the cured encapsulant composition, and wherein the cured encapsulant composition has a Total Outgassing value of 1000 nanograms per gram or less of outgassed compounds of cured encapsulant composition according to Outgassing Test Procedure.

The present disclosure also includes embodiments of a method of assembling a hard disk drive electrical component and printed circuit substrate, wherein the method comprises:
  a) providing an integrated circuit component having a first major surface comprising one or more electrical interconnects;
  b) providing a printed circuit substrate having a first major surface comprising one or more electrical contacts, wherein the first major surface of the integrated faces the first major surface of the printed circuit substrate;
  c) physically and electrically coupling the one or more electrical interconnects to the one or more electrical contacts;
  d) dispensing an uncured encapsulant composition near the space between the integrated circuit component and the printed circuit substrate so that at least a portion of the uncured encapsulant composition flows into at least a portion of the space via capillary action, wherein the uncured encapsulant composition comprises:
    i) an uncured epoxy resin component; and
    ii) an inorganic filler particle component, wherein the inorganic filler particle component is present in an amount in the range from 30 to 80% by weight of the uncured encapsulant composition; and
  c) curing the encapsulant composition that is present in the space between the integrated circuit component and the printed circuit substrate, wherein the cured encapsulant composition has a Total Outgassing value of 1000 nanograms per gram or less of outgassed compounds of cured encapsulant composition according to the Outgassing Test Procedure.

The present disclosure also includes embodiments of an assembled hard disk drive electrical device comprising:
  a) an integrated circuit component having a first major surface comprising one or more electrical leads;
  b) a printed circuit substrate having a first major surface comprising one or more electrical contacts, wherein the first major surface of the integrated faces the first major surface of the printed circuit substrate, wherein at least one of the electrical leads is electrically coupled to at least one of the electrical contacts to form the hard disk drive electrical component; and
  c) a cured encapsulant composition is present in at least a portion of space between the integrated circuit component and the printed circuit substrate, wherein the cured encapsulant composition comprises:
    i) a cured epoxy resin component; and
    ii) an inorganic filler particle component, wherein the inorganic filler particle component is present in an amount from 30 to 80% by weight of the cured encapsulant composition, wherein the cured encapsulant composition has a Total Outgassing value of 1000 nanograms per gram or less of outgassed compounds of cured encapsulant composition according to Outgassing Test Procedure.

BRIEF DESCRIPTION OF THE DRAWINGS

FIG. 1 shows an exploded view of an electronic device utilizing a printed circuit board.

DETAILED DESCRIPTION

Embodiments of the present disclosure include using an encapsulant composition with one or more components to be used in a hard disk drive.
Encapsulant Composition An encapsulant as described herein can provide one or more physical and/or chemical attributes to one or more surfaces to which it is applied to. For example, an encapsulant composition can help provide mechanical integrity, structural integrity, electrical insulation, particle containment, and environmental protection with respect to the surface that it is applied to. The encapsulant composition can be applied to a wide variety of surfaces of an electrical structure used in a hard disc drive. In some embodiments, an electrical structure for use in a hard disc drive includes an electrical device mounted to a substrate (also referred to as an assembled electrical structure). Examples of electrical device include a ceramic cap, an integrated circuit (e.g., a preamplifier integrated circuit), a head pad, and/or a sensor. Examples of substrates include ceramic substrates, laminates (e.g., used in a printed circuit board), flexible substrates (e.g., used in a flex circuit). An example of a using an encapsulant composition according to the present disclosure with a printed circuit and integrated circuit is with "flip chip" technology. Flip chip technology involves interconnecting semiconductor devices (e.g., IC chips) to external circuity with interconnects (e.g., metal bumps) that have been deposited on the semiconductor device (e.g., IC chip pad). Interconnects can be made from a wide variety of electrically conductive materials such as metal, metal alloy, and the like. Interconnects such as metal bumps (e.g., solder, copper, or nickel/gold) can be deposited on the active side of a chip and the chip can be mounted to external circuitry by flipping the active side over so that the metal bumps align and contact matching pads on the external circuit. The metal can be reflowed to complete the interconnect. The encapsulant can then be used as an underfill to flow between the IC chip pad and the printed circuit board via capillary action, and then cured. In the context of using an encapsulant composition as an underfill, the encapsulant can encapsulate one or more structures between the IC chip pad and printed circuit substrate such as the interconnects.

As another example, an encapsulant composition can help seal one or more ceramic surfaces and prevent particles from separating from the surface, especially ceramic surfaces (e.g., loose particles can be generated from dicing and sawing operations in forming an integrated circuit). Loose particles can cause head/media crashes in hard disk drives, which can cause undue damage.

An encapsulant composition according to the present disclosure can include an epoxy resin component and an inorganic filler particle component.

An epoxy resin component can include a single epoxy resin or a plurality of epoxy resins. The epoxy resin component can be mixed with one or more additional components, applied to a surface of, for example, at least a portion of an electrical structure, and then cured. Once cured, the epoxy resin component can help enhance structural integrity, and/or protect one or more surfaces from the surrounding environment. An epoxy resin component can function as a carrier for one or more additional components such as filler particles.

An epoxy resin component can be present in an encapsulant composition in any desired amount. In some embodiments, an epoxy resin can be present in an encapsulant composition in an amount of at least 5% by weight of the encapsulant composition. In some embodiments, an epoxy resin can be present in an encapsulant composition in an amount from 5% to 99.95% by weight of the encapsulant composition, from 5% to 50% by weight of the encapsulant composition, or even from 5% to 30% by weight of the encapsulant composition.

An epoxy resin component can be selected based on one or more considerations such as viscosity, ability to apply and retain it on a surface until it cures, cure rate, and final cure properties.

Also, an epoxy resin component can be selected so that the cured epoxy resin component has a glass transition temperature (Tg) that is compatible with the operating temperature of an electronic device such as a hard disc drive. The Tg of a cured epoxy resin component is the temperature region where the cured polymer component transitions from a hard material to a soft material. Because epoxy resins are thermosetting materials, the final cured epoxy resin component does not melt when heated, but undergoes a softening phase change when heated above its Tg.

The temperature at which an epoxy resin component cures can increase as the Tg of the epoxy resin component increases. Also, the time to cure an epoxy resin component can decrease as the temperature at which the epoxy resin component is exposed to increases. In some embodiments, an epoxy resin component can be cured at a temperature of 120° C. or more, 140° C. or more, or even 160° C. or more.

An epoxy resin component can be selected according to the present disclosure to have a desirable amount of cure within a given time period. The percent cure of the epoxy resin component can be determined according to ASTM E2041. In some embodiments, an encapsulant composition (epoxy resin component) can cure at least 99% in 10 minutes or less, at least 97% in 8 minutes or less, or even at least 90% in 20 minutes or less.

The Tg of a cured epoxy resin component can be determined using Differential Scanning calorimetry (DSC). In some embodiments, the Tg of a cured epoxy resin component can be determined using DSC according to ASTM E1356. The Tg of a cured epoxy resin component is a temperature range reported as a single temperature, which is the midpoint of a temperature range having endpoints defined by the tangets to the two flat regions of a heat flow curve (Heat flow (W/g) versus Temperature). The Tg of a cured epoxy resin component can be based on 100% conversion (or full cure).

The coefficient of thermal expansion (CTE) of a cured epoxy resin can increase in value from a first CTE (CTE1) below or equal to its Tg to a second CTE (CTE2) as the temperature of the cured epoxy resin becomes greater than its Tg. In some embodiments, the Tg of a cured epoxy resin component can be selected based on the operating temperature of its intended environment so that the CTE1 of the cured epoxy resin component does not transition to its CTE2. Accordingly, the Tg can be selected to be higher than the maximum intended operating environment. In some embodiments, an epoxy resin component can be selected so that the cured epoxy resin component has a Tg of at least the operating temperature of a hard disc drive (e.g., of at least the maximum operating temperature of a hard disc drive) or higher. In some embodiments, an epoxy resin component can be selected so that the cured epoxy resin component has a Tg of 100° C. or more, 105° C. or more, 110° C. or more, or even 120° C. or more. Further, the CTE1 of the cured epoxy resin component can be selected so that it does not mismatch with the CTE of adjacent surfaces to an undue degree, which can cause undue stresses and lead to cracking, delamination, structural failure of solder joints, and the like. CTE can be measured using a ThermoMechanical Analyzer according to ASTM E831. In some embodiments, a cured epoxy resin component can have a CTE1 of no more than 50 parts per million (ppm), or even no more than 45 ppm.

An epoxy resin component can also be selected so that if the cured epoxy resin component is exposed to temperatures greater than its Tg during use that the CTE2 of the cured epoxy resin is not such that it cause expansion to an undue degree. In some embodiments, a cured epoxy resin component can have a CTE2 of 200 parts per million (ppm) or less (e.g., from 10 to 150 ppm).

As described above, by selecting an epoxy resin component so that it has an acceptable Tg and CTE after curing, the expansion (if any) of the cured epoxy component can be controlled to be relatively closer to the relevant adjacent surface or surfaces.

An inorganic filler particle component can be included in an encapsulant composition for a variety of reasons. For example, inorganic filler particles can be provided in a type, size, and amount to help more closely match the CTE among the epoxy resin component and a surface in contact with the epoxy resin component such as a printed circuit substrate. A problem with some epoxy resin components is that they have a CTE that is relatively too high as compared to a surface that they are in contact with. Having CTE among adjacent surfaces that are mismatched to an undue degree can cause undue stresses at elevated temperatures, which can lead to cracking, delamination, structural failure of solder joints, and the like. By incorporating materials into the resin such as inorganic particles, the CTE of the encapsulant composition can be controlled (e.g., lowered) to be relatively closer to the relevant adjacent surface or surfaces.

Inorganic filler particles can be made out of a variety of inorganic materials such as electrically insulative inorganic particles. In some embodiments, the inorganic filler particle component can include alumina particles, silica particles, silicon oxide particles, silicon nitride particles, silicon dioxide particles, glass particles, aluminum oxide particles, and/or aluminum nitride particles.

Inorganic filler particles can be any desired size or combination of sizes. In some embodiments, the inorganic filler particles have an average particle size of at least 0.05 micrometers, at least 0.5 micrometers, or even at least 1 micrometer. In some embodiments, the inorganic filler particles have an average particle size in the range from 0.05 to 50 micrometers, from 0.5 to 50 micrometers, 2 to 20 micrometers, or even 0.05 to 1 micrometer.

Inorganic filler particles can have any desired shape such as spherical and/or non-spherical shapes.

Inorganic filler particles can be present in an encapsulation composition in any desired amount. For example, relatively higher amounts of filler particles can be included when solder connections have already been made as compared to when solder is reflowed in the presence of the encapsulant composition that includes filler particles. Relatively less filler particles may be desired because they can hinder wetting of solder to undue degree, which can impair electrical and mechanical integrity of solder connections. In some embodiments, inorganic filler particles can be present in an amount at least 0.05% by weight of the encapsulant composition (e.g., cured or uncured encapsulant composition), at least 2% by weight of the encapsulant composition, or even at least 5% by weight of the encapsulant composition. In some embodiments, inorganic filler particles can be present in an amount from 8 to 20% by weight of the encapsulant composition, from 30 to 70% by weight of the encapsulant composition (e.g., in an underfill composition), or even from 50 to 70% by weight of the encapsulant composition.

An encapsulant composition according to the present disclosure can be referred to as "clean" meaning that it does not experience undue outgassing at operating temperature (e.g., maximum operating temperature). In some embodiments, an encapsulant composition according to the present disclosure can be considered "clean" if it has a Total Outgassing value of 1000 nanograms per gram or less of outgassed compounds of cured encapsulant composition, 500 nanograms per gram or less of outgassed compounds of cured encapsulant composition, or even 300 nanograms per gram or less of outgassed compounds of cured encapsulant composition according to Outgassing Test Procedure (described below). Outgassing (sometimes called offgassing) is the release of a gas that was dissolved, trapped, or absorbed in the encapsulant composition. Outgassing can include sublimation and evaporation (which are phase transitions of a substance into a gas), as well as desorption or seepage from cracks; and gaseous products of slow chemical reactions.

An encapsulant composition according to the present disclosure can include substantially no silane compounds. Silane compounds can be used as a wetting agent to help the encapsulant spread more easily. Unfortunately, silane compounds are susceptible to outgassing, which can impact hard disc drive performance to an undue degree. Advantageously, encapsulant compositions according to the present disclosure can avoid silane compounds. In some embodiments, there is no detectable amount of any silane compound present in an encapsulant composition. Exemplary silane compounds include $SiH_4$.

One or more additives can optionally be included in an encapsulant composition. Examples of such additives include flexibilisers, hardener systems (e.g., epoxies), cross-linking agents (e.g., acid anhydride), catalysts, activators, adhesion promoters, coupling agents, and the like.

Epoxy resin, inorganic filler particles, and one or more optional additives can be combined (e.g., mixed together), applied to one or more surfaces of a hard disk drive component, and cured by any desired techniques.

Two exemplary uses of an encapsulant composition according to the present disclosure in the context of hard disk drive components are described herein below.

Methods of Coating One or More Surfaces of an Electrical Structure for Use in a Hard Disk Drive.

The present disclosure includes embodiments of a method of coating one or more surfaces of at least a portion of an electrical structure (e.g., at least a portion of an electrical device and/or at least a portion of a substrate that the electrical device may be mounted to) that can be used in a hard disk drive. In some embodiments, the method includes applying an uncured encapsulant composition on at least a portion of a surface of the electrical structure, and curing the encapsulant composition.

The uncured encapsulant composition can include uncured epoxy resin component, and inorganic filler particle component. In some embodiments, the uncured encapsulant composition includes substantially no silane compounds. The inorganic filler particle component can be present in an amount of at least 0.05% by weight of the uncured encapsulant composition. The inorganic filler particle component can also have an average particle size of at least 0.05 micrometers.

An encapsulant composition according to the present disclosure can be used with a wide variety of surfaces of electrical structures that are used in a hard disk drive. Exemplary electrical devices that can be assembled into electrical structues include a ceramic cap, a preamplifier integrated circuit, a head pad, and/or a sensor.

A wide variety of techniques can be used to apply an uncured encapsulant composition on at least a portion of a surface of the electrical device. In some embodiments, an uncured encapsulant composition can be applied by dispensing the uncured encapsulant composition from an ink jet onto at least a portion of a surface of the electrical device.

A wide variety of techniques can be used to cure the uncured encapsulant composition. Exemplary techniques include thermal curing, radiation curing, e-beam curing, combinations of these, and the like.

Methods of Assembling a Hard Disk Drive Electrical Device and Printed Circuit Substrate The present disclosure includes embodiments of a method of forming a hard disk drive electrical device that include providing an integrated circuit component having a first major surface including one or more electrical leads; and a printed circuit substrate having a first major surface comprising one or more electrical contacts. Examples of a printed circuit substrate include a printed circuit board or a printed circuit cable (flex). The first major surface of the integrated circuit faces the first major surface of the printed circuit substrate, and at least one of the electrical leads is electrically coupled to at least one of the electrical contacts to form the hard disk drive electrical device. A cured encapsulant composition is present in at least a portion of space between the integrated circuit component and the printed circuit substrate. The cured encapsulant composition includes cured epoxy resin, inorganic filler particles. In some embodiments, the cured encapsulant composition includes substantially no silane compounds. The inorganic filler particles can be present in an amount of at least 2% by weight of the cured encapsulant composition. In some embodiments, the inorganic filler particles can be present in an amount from 30-80%, from 30-70%, or even from 50-70% by weight of the cured encapsulant composition. The inorganic filler particles can have an average particle size in the range from 0.5 to 50 micrometers, or even from 10 to 30 micrometers.

Introducing and curing an encapsulant composition in the space between a printed circuit substrate and an integrated circuit can be performed using a variety of techniques. In some embodiments, the printed circuit substrate is electrically coupled to the integrated circuit before introducing an uncured encapsulant composition into space between the integrated circuit and the printed circuit substrate. For example, one or more electrical leads can be physically and electrically coupled to the one or more electrical contacts followed by dispensing an uncured encapsulant composition near the space between the integrated circuit component and the printed circuit substrate so that at least a portion of the uncured encapsulant composition flows into at least a portion of the space via capillary action. The uncured encapsulant composition can include a relatively high amount of inorganic filler particles (e.g., 40 to 80% by weight of the uncured encapsulant composition) since the integrated circuit has already been electrically coupled to the printed circuit substrate. After dispensing the encapsulant composition, the encapsulant composition that is present in the space between the integrated circuit component and the printed circuit substrate can be cured.

Optionally, fluxing agent can be used for soldering the one or more electrical leads to the one or more electrical contacts.

FIGS. 1-4 illustrate an embodiment of the present disclosure. FIG. 1 shows an exploded view of an example of a hard disk drive 500 in which the present disclosure is particularly useful. The hard disk drive 500 can be controlled in part by a variety of substrate-mounted electrical components. For example, as shown, component 200 is mounted on and electrically connected to a printed circuit cable (PCC) 100, while component 400 is mounted on and electrically connected to a printed circuit board (PCB) 300. These substrates can be in turn electrically connected to hard disk drive 500.

Integrated circuits are also discussed in U.S. Pat. No. 6,680,436 (Xu et al.) and U.S. Publication No. 2014/0177149 (Ramalingam et al.), wherein the entirety of each patent document is incorporated herein by reference for all purposes.

Outgassing Test Procedure:

An electrical structure (or portion thereof) that includes cured encapsulant and/or only the cured encapsulant can be placed in closed Teflon vessels that are subsequently placed in a heating source at 85° C. for three hours (also referred to as DHS Sampling time). The sample chambers are purged with high purity nitrogen as volatile compounds are outgassed. The nitrogen carries outgassed compounds to adsorbent tubes, which trap the outgassed compounds. The adsorbent tubes are removed and placed onto a thermal desorbtion system, which desorbs the trapped compounds and introduces them into a Gas chromatograph mass spectrometers for analysis and tested to determine the amount of a given compound that is outgassed. The amount of outgassed compound is compared with the maximum allowable amount it the table below to determine acceptability.

Maximum Allowable Amount of Compound Outgassed (ng/g or ppb):
Total organic acids—300,000 ng/g
Total Methacrylates and alkyl acrylates—1,000,000 ng/g
Hydroxycylohexyl Phenyl Ketone—125,000 ng/g
a,a,-Dimethoxyphenyl Acetophenone—10,000 ng/g
Total Siloxanes—5,000 ng/g
Total Amines—100,000 ng/g
Total Amides—1,000 ng/g
Total Hydrocarbons—350,000 ng/g
Total Outgassing—3,000,000 ng/g

What is claimed is:

1. A method of coating one or more surfaces of at least a portion of an electrical structure for use in a hard disk drive, wherein the method comprises:
   a) applying an uncured encapsulant composition on at least a portion of a surface of the electrical structure, wherein the uncured encapsulant composition comprises:
      i) uncured epoxy resin component; and
      ii) an inorganic filler particle component, wherein the inorganic filler particle component is present in an amount of at least 0.05% by weight of the uncured encapsulant composition; and
   b) curing the encapsulant composition, wherein the cured encapsulant composition has a Total Outgassing value of 1000 nanograms per gram or less of outgassed compounds of cured encapsulant composition according to Outgassing Test Procedure.

2. The method of claim 1, wherein the uncured encapsulant composition cures at least 95% in 10 minutes or less at a temperature of 130° C. or more.

3. The method of claim 1, wherein the electrical structure comprises a ceramic cap, a preamplifier integrated circuit, a head pad, and/or a sensor.

4. An electrical structure for use in a hard disk drive, wherein the electrical structure has a coating on at least a portion of a surface of the electrical structure, wherein the coating comprises a cured encapsulant composition, wherein the cured encapsulant composition comprises:
   a) cured epoxy resin component; and b) an inorganic filler particle component, wherein the inorganic filler particle component is present in an amount of at least 0.05% by weight of the cured encapsulant composition, and wherein the cured encapsulant composition has a Total Outgassing value of 1000 nanograms per gram or less of outgassed compounds of cured encapsulant composition according to Outgassing Test Procedure.

5. The electrical component of claim 4, wherein the cured encapsulant is derived from an uncured encapsulant composition that cures at least 95% in 10 minutes or less at a temperature of 130° C. or more.

6. The electrical component of claim 4, wherein the cured encapsulant composition includes substantially no silane compounds.

7. The electrical component of claim 4, wherein inorganic filler particles have an average particle size of at least 0.05 micrometers.

8. The electrical component of claim 4, wherein the electrical structure comprises a ceramic cap, a preamplifier integrated circuit, a head pad, and/or a sensor.

9. A hard disk drive comprising the electrical structure of claim 4.

10. A method of assembling a hard disk drive electrical component and printed circuit substrate, wherein the method comprises:
   a) providing an integrated circuit component having a first major surface comprising one or more electrical interconnects;
   b) providing a printed circuit substrate having a first major surface comprising one or more electrical contacts, wherein the first major surface of the integrated circuit component faces the first major surface of the printed circuit substrate;
   c) physically and electrically coupling the one or more electrical interconnects to the one or more electrical contacts, wherein a space is formed between the integrated circuit component and the printed circuit substrate;
   d) dispensing an uncured encapsulant composition near the space between the integrated circuit component and the printed circuit substrate so that at least a portion of the uncured encapsulant composition flows into at least a portion of the space via capillary action, wherein the uncured encapsulant composition comprises:
      i) an uncured epoxy resin component; and
      ii) an inorganic filler particle component, wherein the inorganic filler particle component is present in an amount in the range from 30 to 80% by weight of the uncured encapsulant composition; and
   e) curing the encapsulant composition that is present in the space between the integrated circuit component and the printed circuit substrate, wherein the cured encapsulant composition has a Total Outgassing value of 1000 nanograms per gram or less of outgassed compounds of cured encapsulant composition according to Outgassing Test Procedure.

11. The method of claim 10, wherein the cured encapsulant composition includes substantially no silane compounds.

12. The method of claim 10, wherein inorganic filler particles have an average particle size of at least 0.05 micrometers.

13. The method of claim 10, wherein dispensing an uncured encapsulant composition comprises dispensing the uncured encapsulant composition from an ink jet near the space between the integrated circuit component and the printed circuit substrate.

14. The method of claim 10, wherein the uncured encapsulant composition cures at least 95% in 10 minutes or less at a temperature of 130° C. or more.

15. The method of claim 10, wherein the inorganic filler particle component comprises alumina particles, silica particles, silicon oxide particles, silicon nitride particles, silicon dioxide particles, glass particles, aluminum oxide particles, and/or aluminum nitride particles.

16. The method of claim 10, wherein the inorganic filler particle component has an average particle size in the range from 0.5 to 50 micrometers.

* * * * *